US011171002B2

(12) United States Patent
Arnold et al.

(10) Patent No.: US 11,171,002 B2
(45) Date of Patent: Nov. 9, 2021

(54) ALTERNATING HARDMASKS FOR TIGHT-PITCH LINE FORMATION

(71) Applicant: TESSERA, INC., San Jose, CA (US)

(72) Inventors: John C. Arnold, North Chatham, NY (US); Anuja E. DeSilva, Slingerlands, NY (US); Nelson M. Felix, Briarcliff Manor, NY (US); Chi-Chun Liu, Altamont, NY (US); Yann A. M. Mignot, Slingerlands, NY (US); Stuart A. Sieg, Albany, NY (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 16/798,823

(22) Filed: Feb. 24, 2020

(65) Prior Publication Data

US 2020/0266066 A1     Aug. 20, 2020

Related U.S. Application Data

(63) Continuation of application No. 16/058,088, filed on Aug. 8, 2018, now Pat. No. 10,580,652, which is a continuation of application No. 15/463,659, filed on Mar. 20, 2017, now Pat. No. 10,103,022.

(51) Int. Cl.
| | |
|---|---|
| *H01L 21/033* | (2006.01) |
| *H01L 21/308* | (2006.01) |
| *H01L 21/311* | (2006.01) |
| *H01L 21/3213* | (2006.01) |
| *H01L 29/66* | (2006.01) |
| *H01L 21/8234* | (2006.01) |

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/3081* (2013.01); *H01L 21/3086* (2013.01); *H01L 21/3088* (2013.01); *H01L 21/31122* (2013.01); *H01L 21/31144* (2013.01); *H01L 21/32137* (2013.01); *H01L 21/823431* (2013.01); *H01L 29/6656* (2013.01); *H01L 29/66795* (2013.01); *Y10S 438/947* (2013.01); *Y10S 438/95* (2013.01)

(58) Field of Classification Search
None
See application file for complete search history.

(56) References Cited

U.S. PATENT DOCUMENTS

| | | | |
|---|---|---|---|
| 5,821,169 | A | 10/1998 | Nguyen et al. |
| 8,114,306 | B2 | 2/2012 | Cheng et al. |
| 8,278,221 | B2 | 10/2012 | Koh et al. |

(Continued)

OTHER PUBLICATIONS

Douglas J. Guerrero et al., Multifunctional hardmask neutral layer for directed self-assembly (DSA) patterning, Proc. SPIE 8680 (Mar. 26, 2013).

(Continued)

*Primary Examiner* — Jiong-Ping Lu
(74) *Attorney, Agent, or Firm* — Lee & Hayes, P.C.

(57) ABSTRACT

Methods of forming fins include masking a region on a three-color hardmask fin pattern, leaving a fin of a first color exposed. The exposed fin of the first color is etched away with a selective etch that does not remove fins of a second color or a third color. The mask and all fins of a second color are etched away. Fins are etched into a fin base layer using the fins of the first color and the fins of the third color.

16 Claims, 12 Drawing Sheets

(56) References Cited

U.S. PATENT DOCUMENTS

| | | | |
|---|---|---|---|
| 8,859,433 | B2 | 10/2014 | Abdallah et al. |
| 8,900,665 | B2 | 12/2014 | Koshy |
| 9,099,401 | B2 | 8/2015 | He et al. |
| 9,269,268 | B2 | 2/2016 | Jacob |
| 9,287,135 | B1 | 3/2016 | Doris et al. |
| 9,337,033 | B1 | 5/2016 | Glodde et al. |
| 9,349,604 | B2 | 5/2016 | Rathsack et al. |
| 9,368,349 | B2 | 6/2016 | Huang et al. |
| 9,391,141 | B2 | 7/2016 | Chan et al. |
| 9,425,058 | B2 | 8/2016 | Kim et al. |
| 9,431,265 | B2 | 8/2016 | Cheng et al. |
| 9,450,079 | B2 | 9/2016 | Cheng et al. |
| 9,515,089 | B1 | 12/2016 | Cheng et al. |
| 9,536,750 | B1 | 1/2017 | Chi et al. |
| 9,680,018 | B2 | 6/2017 | Hashemi et al. |
| 9,837,410 | B1 | 12/2017 | Cheng |
| 9,922,972 | B1 | 3/2018 | Qiu et al. |
| 9,935,181 | B2 | 4/2018 | Cheng et al. |
| 9,941,164 | B1 | 4/2018 | Kim |
| 2010/0267328 | A1 | 10/2010 | Johnson et al. |
| 2011/0111596 | A1* | 5/2011 | Kanakasabapathy ........................ H01L 21/0338 438/694 |
| 2014/0284667 | A1 | 9/2014 | Basker et al. |
| 2014/0322915 | A1 | 10/2014 | Lee et al. |
| 2015/0255542 | A1 | 9/2015 | Cai et al. |
| 2016/0042964 | A1 | 2/2016 | Lo et al. |
| 2016/0068430 | A1* | 3/2016 | Suenaga ................. C03C 15/00 216/41 |
| 2016/0071930 | A1 | 3/2016 | Bentley et al. |
| 2016/0211168 | A1 | 7/2016 | Paak et al. |
| 2016/0240474 | A1 | 8/2016 | Yu-Tseng et al. |
| 2016/0254369 | A1 | 9/2016 | Yi et al. |
| 2017/0219925 | A1 | 8/2017 | Wang et al. |
| 2018/0122637 | A1 | 5/2018 | Sherpa et al. |

OTHER PUBLICATIONS

Ting Han et al., A Paradigm Shift in Patterning Foundation from Frequency Multiplication to Edge-Placement Accuracy—A Novel Processing Solution by Selective Etching and Alternating-Material Self-Aligned Multiple Patterning; Proc. SPIE 9777, Alternative Lithographic Technologies VIII, 977718 (Mar. 22, 2016).

Shengxiang Ji, Directed self-assembly of block copolymers on chemical patterns: A platform for nanofabrication, Progress in Polymer Science 54-55 (Oct. 2015).

Hongyi Liu, Layout Decomposition and Synthesis for a Modular Technology to Solve the Edge-Placement Challenges by Combining Selective Etching, Direct Stitching, and Alternating-Material Self-Aligned Multiple Patterning Processes, Design-Process-Technology Co-optimization for Manufacturability X, edited by Luigi Capodieci and Jason P. Cain, Proc. of SPIE vol. 9781 (Mar. 2016).

* cited by examiner

ALTERNATING HARDMASKS FOR TIGHT-PITCH LINE FORMATION

CROSS-REFERENCE TO RELATED APPLICATION(S)

This application is a continuation of and claims priority to U.S. patent application Ser. No. 16/058,088, filed Aug. 8, 2018, now U.S. Pat. No. 10,580,652, issued Mar. 3, 2020, which is a continuation of U.S. patent application Ser. No. 15/463,659, filed Mar. 20, 2017, now U.S. Pat. No. 10,103,022, issued Oct. 16, 2018, the disclosures of which are incorporated herein by reference in their entirety.

BACKGROUND

Technical Field

The present invention generally relates to semiconductor fabrication and, more particularly, to the formation of hardmasks in semiconductor fabrication processes.

Description of the Related Art

Fin field effect transistors (FinFETs) and other fin-based devices are frequently used in semiconductor structures to provide small-scale integrated circuit components. As these devices scale down in size, performance can be increased but fabrication becomes more difficult. In particular, errors in edge placement, critical dimension, and overlay approach the size of the structures being fabricated, making it difficult to accurately form such structures.

One particular challenge in forming fin structures is the selective removal of particular fins. For example, while a series of fins can be created using, e.g., sidewall image transfer techniques, significant errors in masking the fins may occur when operating near the limit of the lithographic process. Such errors may cause fins neighboring the removed fin to be damaged or removed entirely.

SUMMARY

A method of forming fins includes masking a region on a three-color hardmask fin pattern, leaving a fin of a first color exposed. The exposed fin of the first color is etched away with a selective etch that does not remove fins of a second color or a third color. The mask and all fins of a second color are etched away. Fins are etched into a fin base layer using the fins of the first color and the fins of the third color.

A method of forming a three-color hardmask fin pattern includes forming seed layer fins. Self-assembled fins are formed by directed self-assembly on the seed layer fins. A layer of a first color is etched using the self-assembled fins as a mask to form fins of a first color. A second-color material is deposited around the fins of the first color. Fins of the first color are etched away, leaving at least one fin of the first color. Fins of a third color are formed in gaps left by etching away fins of the first color.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a hardmask fabrication process that may be used for fin formation in semiconductor fabrication. The present embodiment forms hardmask fins of three different compositions that have mutual etch selectivity, such that a spacing between fins of the same type is large enough that lithographic masking errors will not interfere when selectively removing fins. This provides a tri-color alternating hardmask, where the three different "colors" represent the three different fin hardmask composition. Thus the term "color" is defined herein to refer to one particular hardmask composition.

The present disclosure therefore refers to "first-color," "second-color," and "third-color" materials and fins. Each of these "colors" can be etched selectively to the other two, making it possible to remove a fin of one color without damaging nearby fins of a different color.

Figure 1:
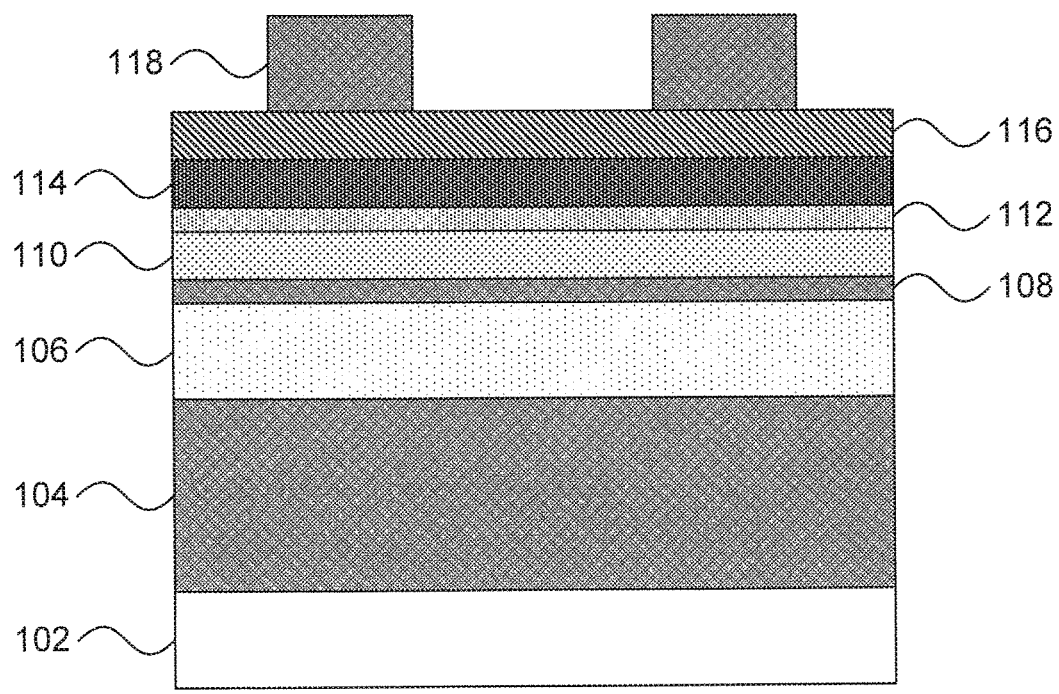
FIG. 1 is a cross-sectional diagram of a step in the formation of a tri-color hardmask in accordance with one embodiment of the present invention.

Referring now to FIG. 1, a cross-sectional diagram of a step in forming tri-color alternating hardmask is shown. A layer of fin base material 104 is formed on a semiconductor substrate 102. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The fin base material 104 may be any appropriate material that may be used as a hardmask for the eventual formation of semiconductor fins in the semiconductor substrate 102. In one embodiment, it is contemplated that the layer of fin base material 104 may have a thickness of about 40 nm. It is specifically contemplated that silicon nitride may be used for the fin base material 104, but it should be understood that any appropriate hardmask material having etch selectivity with the underlying semiconductor and the three tri-color hardmask materials may be used. As used herein, the term "selective" in reference to a material removal process denotes that the rate of material removal for a first material is greater than the rate of removal for at least another material of the structure to which the material removal process is being applied.

A layer of first-color hardmask material 106 is formed on the fin base material 104. It is specifically contemplated that the first-color hardmask material 106 may be formed from amorphous silicon, but any appropriate hardmask material having etch selectivity with the fin base material 104 and the other two tri-color hardmask materials may be used instead. In one embodiment the layer of first-color hardmask material 106 may have a thickness of about 20 nm.

A stack of layers is formed on top of the layer of first-color hardmask material 106. In particular, a first stack layer 108 is formed on the layer of first-color hardmask material 106 and may be formed from the same material as the fin base material 104 or any other appropriate material. In one embodiment the first stack layer 108 may have a thickness of about 5 nm. A second stack layer 110 is formed on the first stack layer 108. It is specifically contemplated that the second stack layer 110 may be formed from a dielectric material such as silicon boron carbonitride (SiBCN), as this material etches slowly in hydrofluoric acid, although other dielectric materials such as silicon carbonitride (SiCN) or silicon oxycarbide (SiOC) may be used instead. The second stack layer 110 may have a thickness of about 10 nm.

A thin seed layer of polymer material 112 is formed on the stack. It is specifically contemplated that the seed layer 112 may be formed from, e.g., cross-linkable polystyrene, though it should be understood that other materials may be selected instead. The seed layer 112 is selected for its ability to guide later self-assembly of block copolymers (BCPs). In particular, seed material should match one of the two chains of the block copolymer system. For example, if a polystyrene/poly(methyl methacrylate) (PMMA) block copolymer is used, the seed layer 112 may be cross-linkable polystyrene. If a polystyrene/polyvinylpyridine (PVP) block copolymer is used, then the seed layer 112 may be cross-linkable PVP. In one particular embodiment, the seed layer 112 may be formed to a thickness between about 5 nm and about 8 nm, though it should be understood that greater or lesser thicknesses are also contemplated.

A protection layer 114 is formed on the stack. The protection layer ensures that the surface chemistry of the seed layer 112 is preserved through subsequent process steps, in particular in the deposition of spacer layers, which could otherwise consume or damage the seed layer 112 if a plasma-enhanced deposition process is used. It is specifically contemplated that homopolymer polystyrene may be used for the protection layer 114, since it is an uncrosslinked polystyrene that is very similar to the underlying crosslinked polystyrene. However, other possible materials for the protection layer 114 include, without limitation, a silicon anti-reflective coating, a titanium anti-reflective coating, or a spin-on oxide material. The thickness of the protection layer 114 should be large enough to adequately protect the surface of the underlying seed layer 112.

A layer of oxide 116 is formed on the protection layer 114. The oxide layer 116 is used in later steps to help define sidewall image fins and may be formed from, e.g., silicon dioxide. Mandrels 118 are then formed on the oxide layer 116. A low-temperature adhesion promotion process is used to form the mandrels 118, for example hexamethyldisilazane (HMDS) at a temperature of around 80° C. If higher temperatures are used, thermal expansion in the protection layer 114 can cause misalignment of, or damage to, the mandrels 118. In one embodiment, the mandrels 118 have a pitch of about 80 nm and may be formed by a lithography process using, e.g., 193 nm light.

Figure 2:
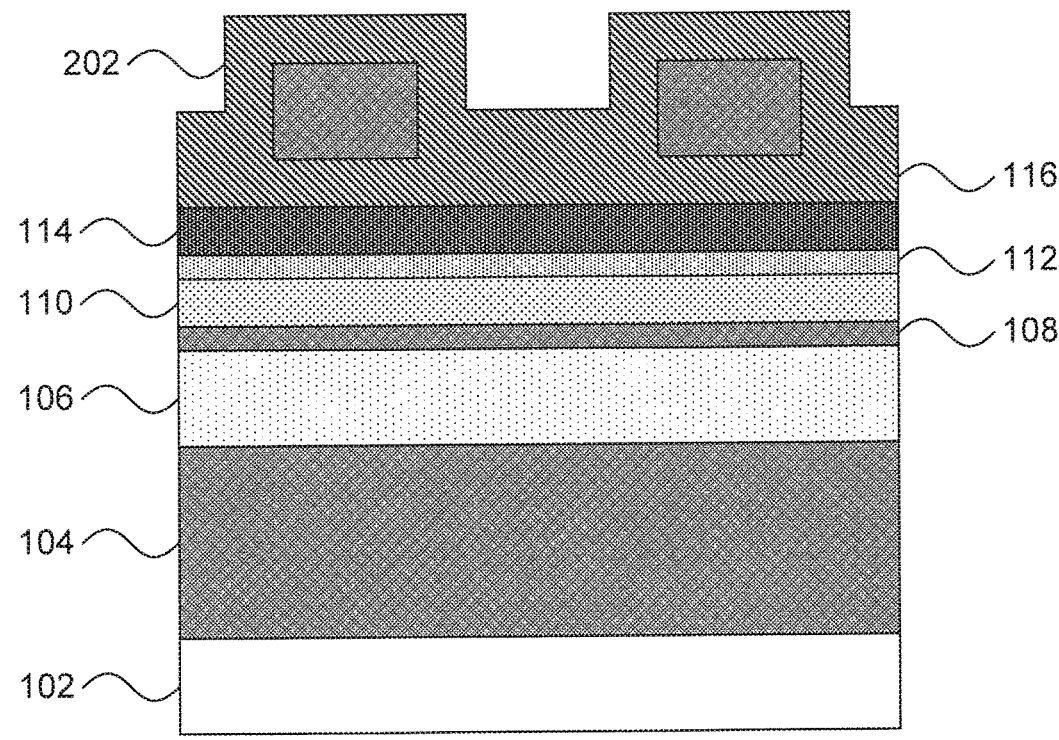
FIG. 2 is a cross-sectional diagram of a step in the formation of a tri-color hardmask in accordance with one embodiment of the present invention.

Referring now to FIG. 2, a cross-sectional diagram of a step in forming tri-color alternating hardmask is shown. An additional layer of oxide 202 is deposited over the mandrels 118. It is specifically contemplated that the additional layer of oxide 202 may be formed from the same material as the oxide layer 116 and may have an exemplary thickness of about 25 nm to about 30 nm.

Figure 3:
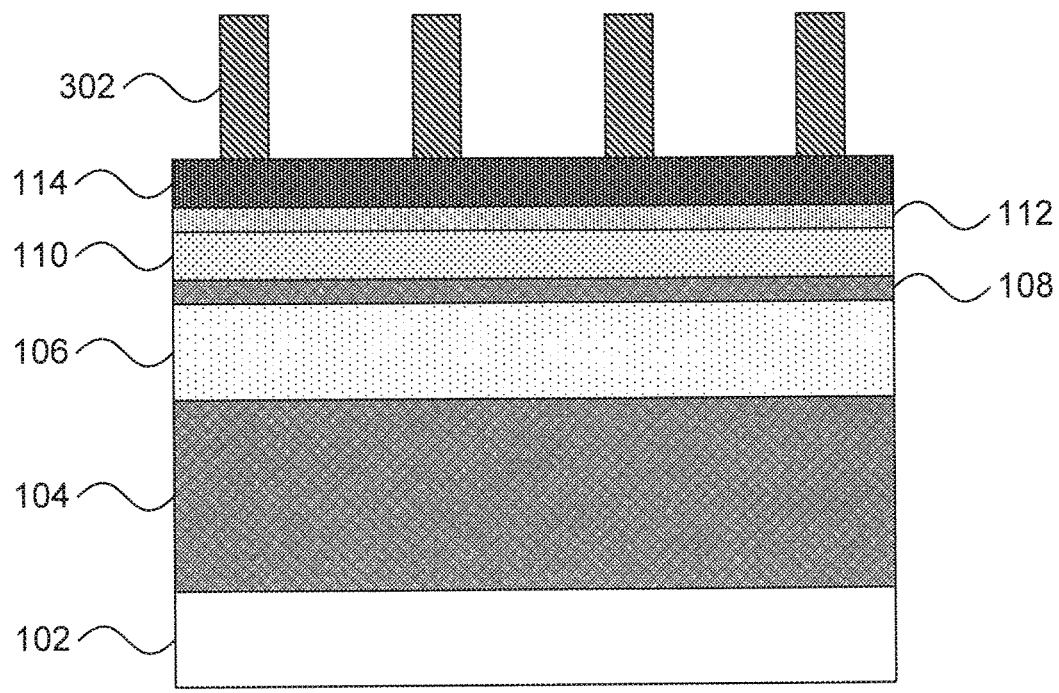
FIG. 3 is a cross-sectional diagram of a step in the formation of a tri-color hardmask in accordance with one embodiment of the present invention.

Referring now to FIG. 3, a cross-sectional diagram of a step in forming tri-color alternating hardmask is shown. The additional layer of oxide 202 is etched back to expose the mandrels 118 using, e.g., an anisotropic etch such as reactive ion etching (RIE). The mandrels 118 are etched away using any appropriate etch including, for example, a wet or dry isotropic chemical etch. The remaining oxide layer 202/116 is further etched anisotropically to remove the oxide material from horizontal surfaces, leaving behind oxide fins 302.

RIE is a form of plasma etching in which, during etching, the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point include ion beam etching, plasma etching or laser ablation.

Figure 4:
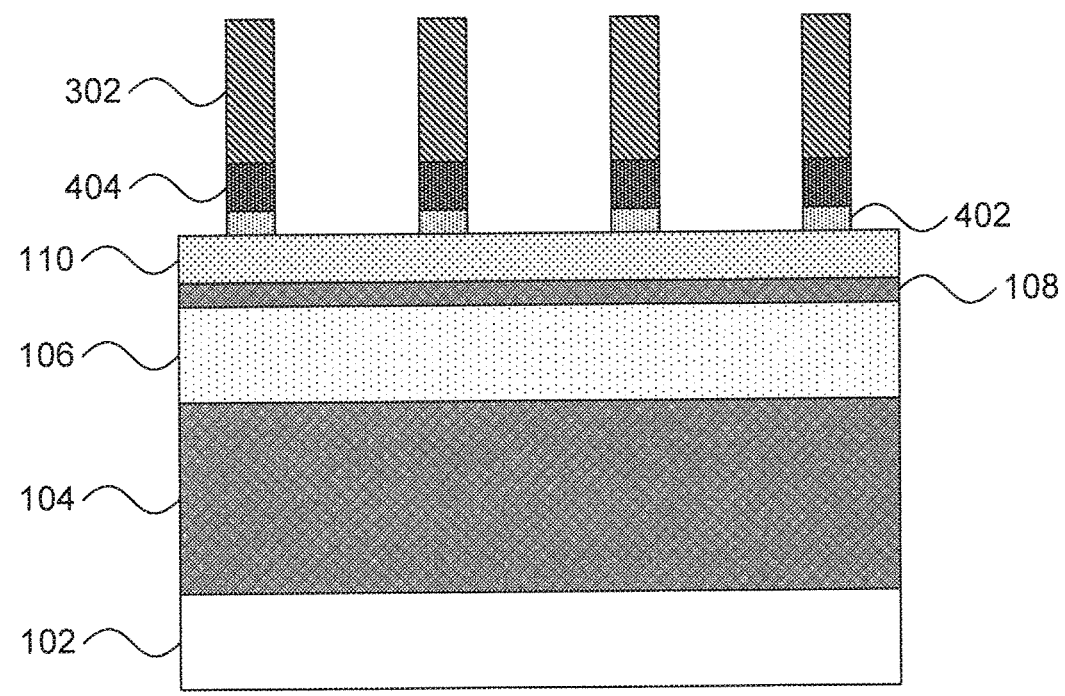
FIG. 4 is a cross-sectional diagram of a step in the formation of a tri-color hardmask in accordance with one embodiment of the present invention.

Referring now to FIG. 4, a cross-sectional diagram of a step in forming tri-color alternating hardmask is shown. The fins 302 are used as a mask to etch the seed layer 112 and the protection layer 114. A directional etch, such as RIE may be used. Remaining mask fin 302 after etch is then stripped by solvent that keeps the seed layer portions 402 intact. Portions of the protection layer 404 remain on fins of the seed layer 402.

Figure 5:
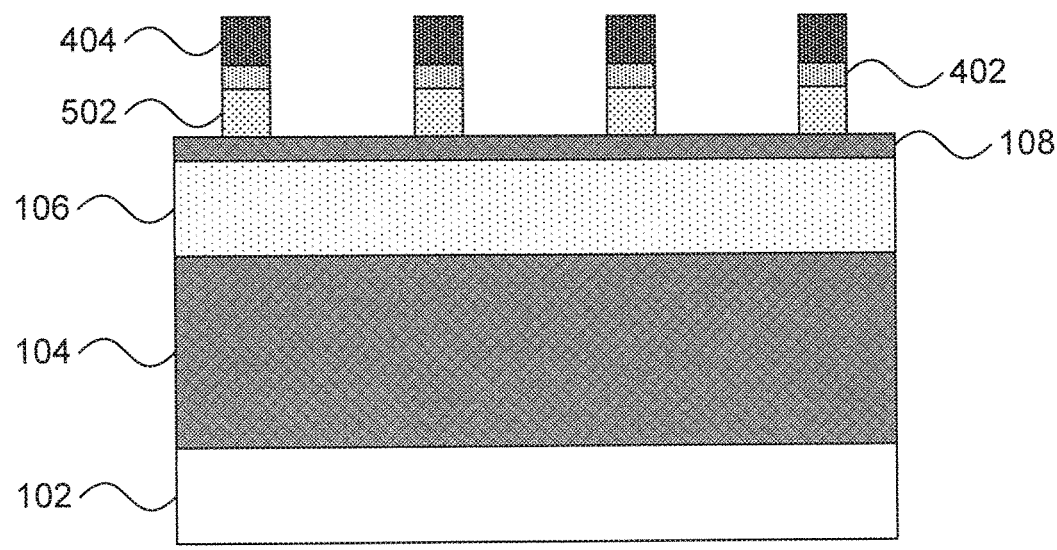
FIG. 5 is a cross-sectional diagram of a step in the formation of a tri-color hardmask in accordance with one embodiment of the present invention.

Referring now to FIG. 5, a cross-sectional diagram of a step in forming tri-color alternating hardmask is shown. The second stack layer 110 is anisotropically etched down using the above fins as a mask. If SiBCN is used for the second stack layer 110, a dry chemical etch may be used followed by, e.g., a buffered hydrofluoric acid etch to remove the oxide fins 302. The buffered hydrofluoric acid may cause the remaining portions of the protection layer 404 to collapse.

Figure 6:
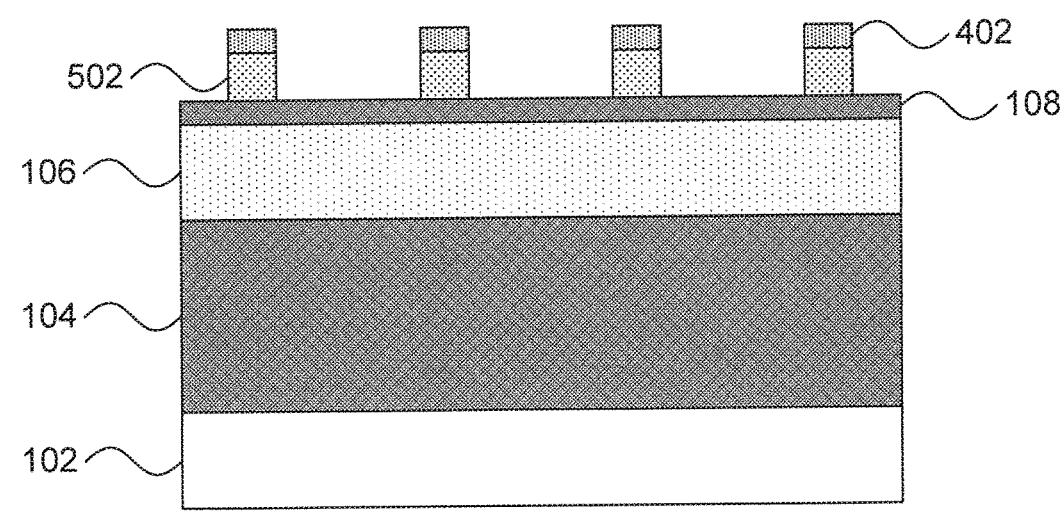
FIG. 6 is a cross-sectional diagram of a step in the formation of a tri-color hardmask in accordance with one embodiment of the present invention.

Referring now to FIG. 6, a cross-sectional diagram of a step in forming tri-color alternating hardmask is shown. The remaining portions of the protection layer 404 are removed using an appropriate solvent. An optional oxygen flash may be applied before this rinse, if needed.

Figure 7:
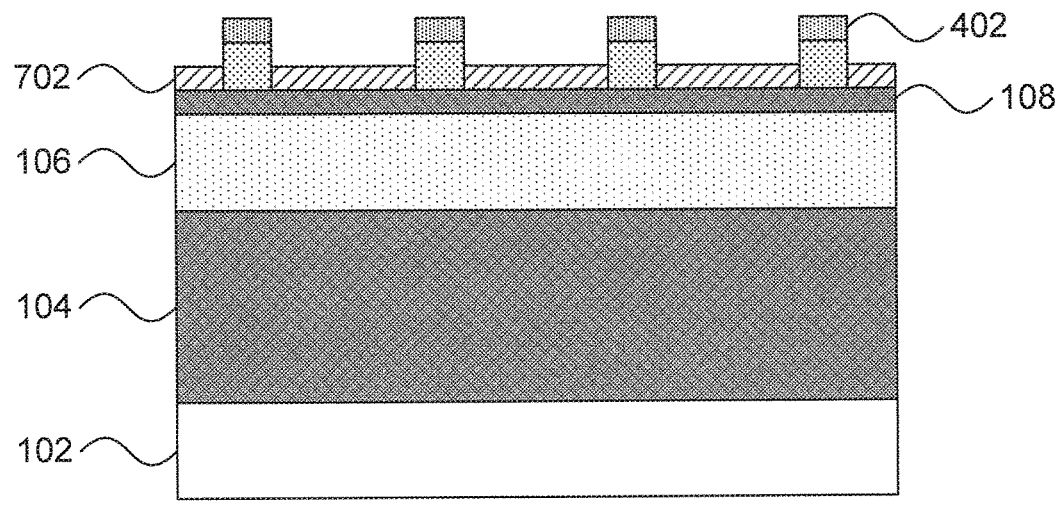
FIG. 7 is a cross-sectional diagram of a step in the formation of a tri-color hardmask in accordance with one embodiment of the present invention.

Referring now to FIG. 7, a cross-sectional diagram of a step in forming tri-color alternating hardmask is shown. A brush polymer layer 702 is applied over the first stack layer 108. The brush polymer 702 may be a linear polymer with a functional group at the chain end that bonds with the underlying substrate except material 204. Brush material 702 may be deposited using, e.g., spin coating. Limited by only one functional group per chain, a monolayer of brush is bonded to 108 and the sidewall of 502 while the excess brush can be rinsed away using solvents. The resulting thickness of the brush polymer layer 702 depends on the molecular size of the polymer, which is typically in the range of 2-10 nm. The pattern composed of 502, 402, and 702 is referred to as the guiding pattern for directed self-assembly. The brush polymer itself can be a random copolymer of the constituents of the block copolymer. For example, a polymer (styrene-random-MMA)-"end group" brush can be used for polystyrene-PMMA block copolymers.

Figure 8:
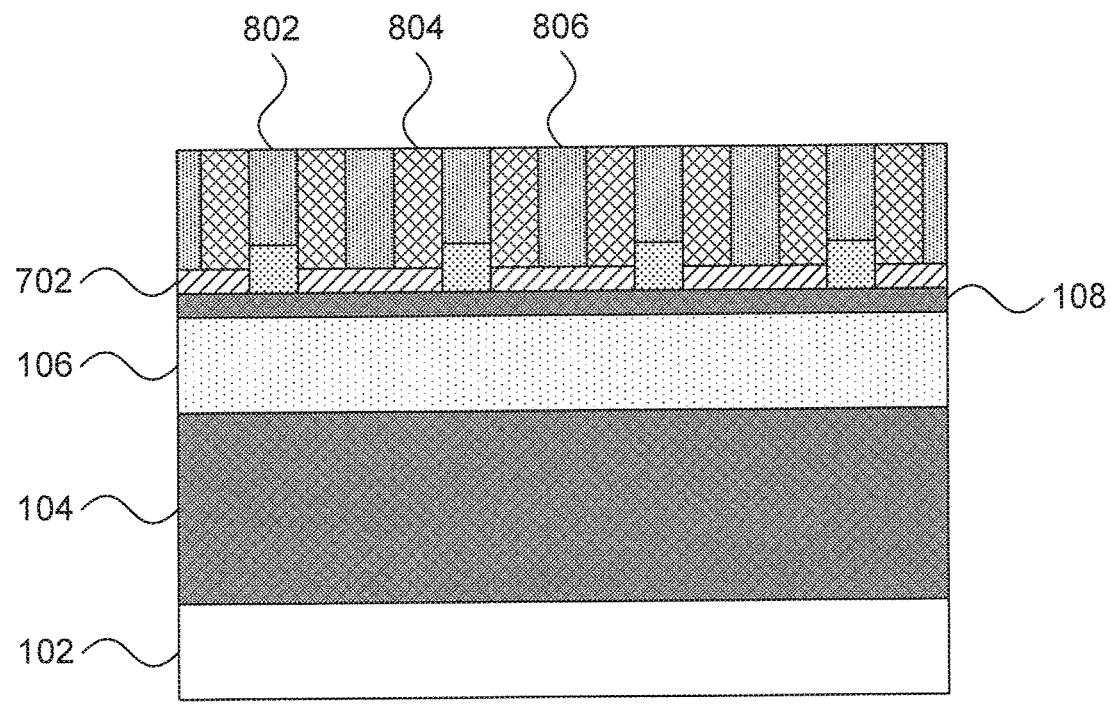
FIG. 8 is a cross-sectional diagram of a step in the formation of a tri-color hardmask in accordance with one embodiment of the present invention.

Referring now to FIG. 8, a cross-sectional diagram of a step in forming tri-color alternating hardmask is shown. A layer of block copolymers (BCP) is spin-coated over the guiding pattern and annealed between about 200 and about 280° C. for between about 5 and 100 minutes under nitrogen environment to promote the self-assembly process. This directed self-assembly (DSA) process of the BCPs will result in micro-domains 802, which will align to 402, 804, and 806, based on the locations of the remaining portions of seed layer 402. A BCP material used in this case is a linear polymer chain with two blocks of chemically distinct polymers covalently bonded together. In one specific example, the self-assembling BCP material may have one block that is polystyrene, e.g., forming fins 802 and 806, and one block that is poly(methyl methacrylate) (PMMA), e.g., forming fins 804.

The lengths of the polymer chains can be selected to produce micro-domains with pitch between about 10 nm and about 200 nm. In this case, it is specifically contemplated that the self-assembling material may have halves of equal length of about 5 nm each, forming a chain with a total length of about 10 nm. When the chains self-assemble, with like ends facing one another, the resulting fins of each material are about, e.g., 10 nm in width. The resulting alternating fin configuration has fin pitch much smaller than the original fin pitch on the guiding pattern. For example, if the mandrels 118 were formed with a fin pitch of about 80 nm, the fins of first DSA material and second DSA material may have a respective fin pitch of about 20 nm.

Figure 9:
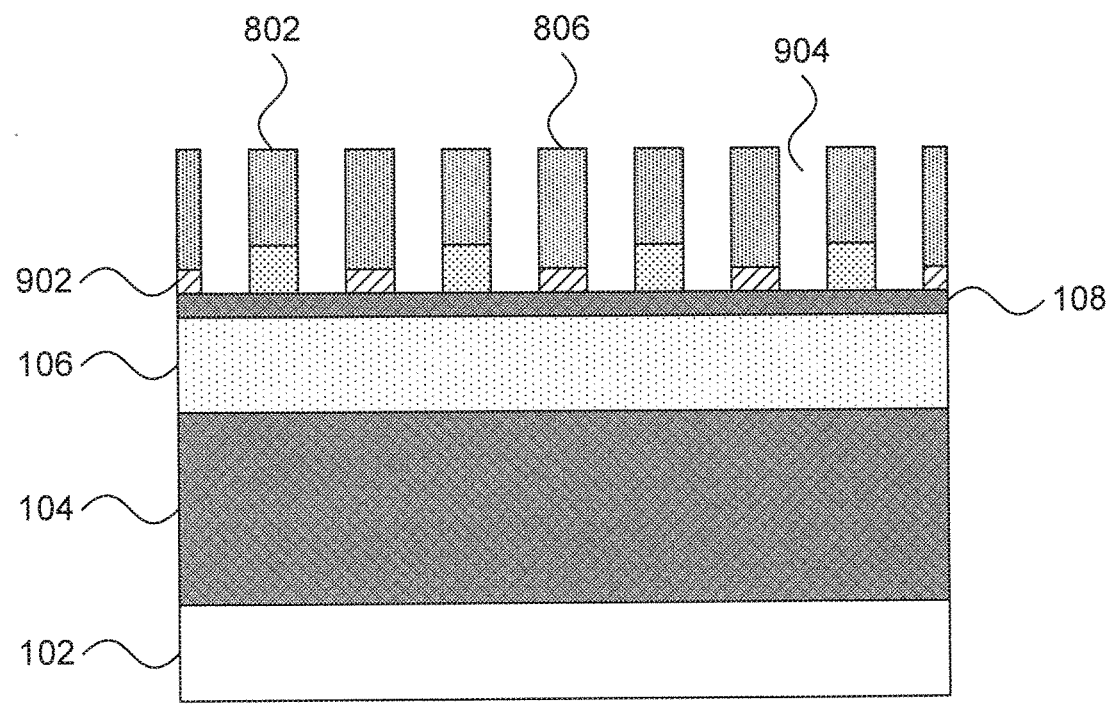
FIG. 9 is a cross-sectional diagram of a step in the formation of a tri-color hardmask in accordance with one embodiment of the present invention.

Referring now to FIG. 9, a cross-sectional diagram of a step in forming tri-color alternating hardmask is shown. The fins of second BCP block 804 are removed by selective etching, leaving gaps 904 between the fins of first DSA material 802/806. The etch selectively removes the second DSA material 804 with only partial consumption of the first DSA material 802/806 and also etches down into the brush polymer layer 702, leaving remaining brush polymer 902. Depending on the etch process chosen, selectivity between 804 and 802/806 is about or greater than 2.

Figure 10:
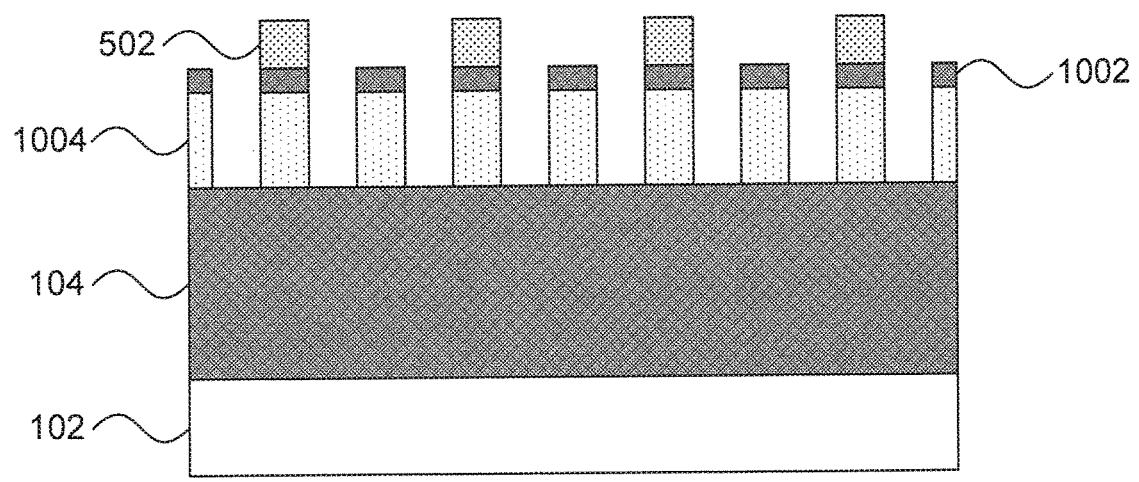
FIG. 10 is a cross-sectional diagram of a step in the formation of a tri-color hardmask in accordance with one embodiment of the present invention.

Referring now to FIG. 10, a cross-sectional diagram of a step in forming tri-color alternating hardmask is shown. Using the fins of first DSA material 802/806 as a mask, the layer of first-color hardmask material 106 is etched down. A first breakthrough etch, such as RIE, anisotropically etches the material of the first stack layer 108. Because 802/806 domains have a material-controlled, uniform dimension, any irregularities in the caps of second stack material 202 can be trimmed and rectified during the breakthrough etch. A second anisotropic etch, such as RIE, removes material from the layer of first-color hardmask material 106, forming fins 1004 with caps of the first stack material 1002. Caps of the second stack material 502 remain on alternating fins, providing fins of alternating heights.

Figure 11:
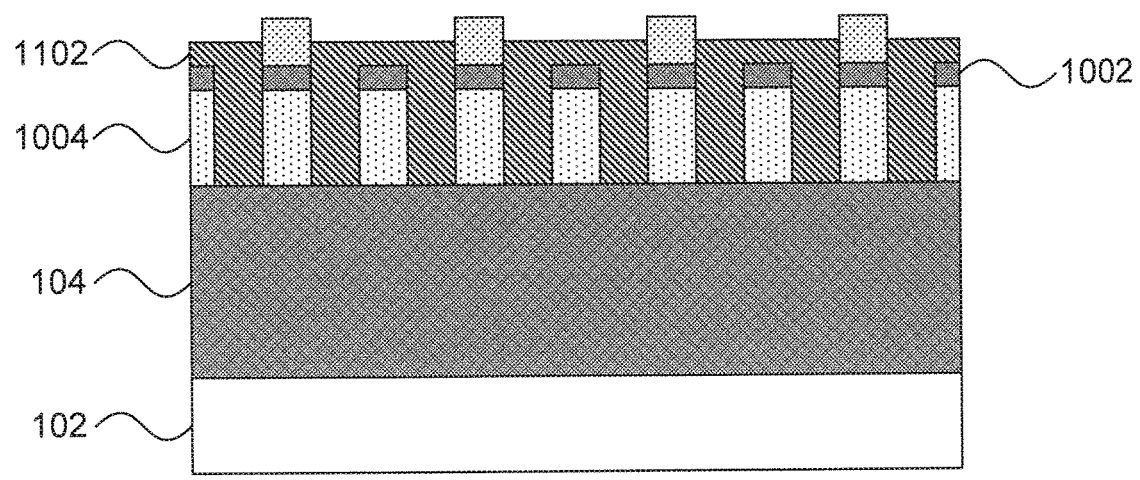
FIG. 11 is a cross-sectional diagram of a step in the formation of a tri-color hardmask in accordance with one embodiment of the present invention.

Referring now to FIG. 11, a cross-sectional diagram of a step in forming tri-color alternating hardmask is shown. An organic planarizing layer (OPL) 1102 is deposited onto the surface and recessed down below the height of the caps of second stack material 502 but above the height of the caps of first stack material 1002. In one embodiment, the OPL 1102 may be formed from, e.g., spin-on carbon that forms an amorphous-like carbon structure, but any appropriate planarization material may be used instead. The OPL 1102 is formed as a second-color hardmask material that has etch selectivity with the fin base material 104, the fins of first-color hardmask material 1004, and a third-color hardmask material.

Figure 12:
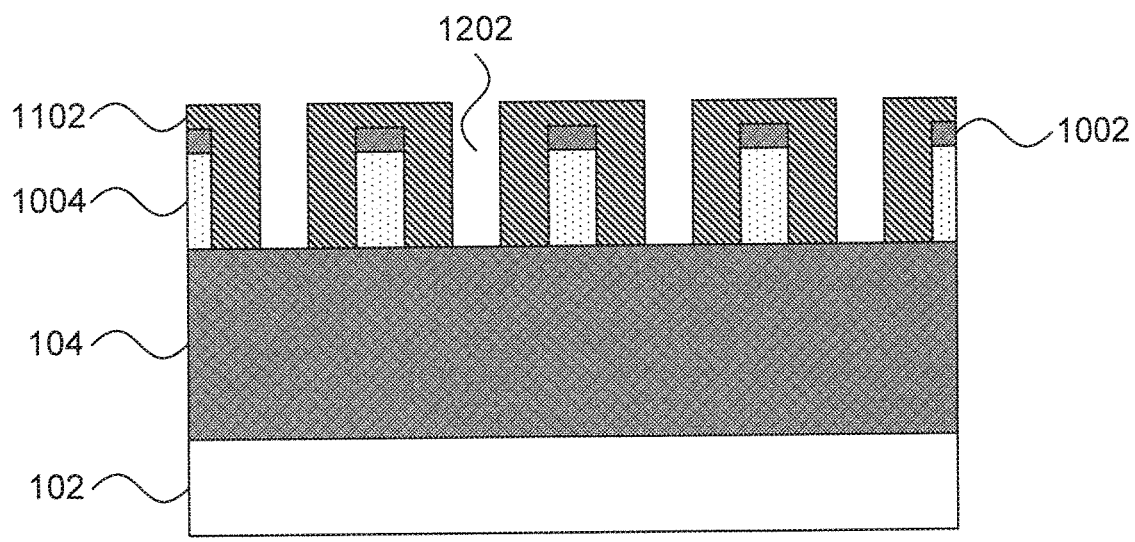
FIG. 12 is a cross-sectional diagram of a step in the formation of a tri-color hardmask in accordance with one embodiment of the present invention.

Referring now to FIG. 12, a cross-sectional diagram of a step in forming tri-color alternating hardmask is shown. The caps of second stack material 502 are removed selectively using, e.g., a buffered oxide etch, and the exposed caps of the second stack material 1002 are removed by a selective etch that leaves the OPL 1102 undamaged. Exposed fins 1004 are then removed by a selective etch, leaving behind those fins 1004 that are protected by the OPL 1102. Gaps 1202 remain between regions of the OPL 1102.

Figure 13:
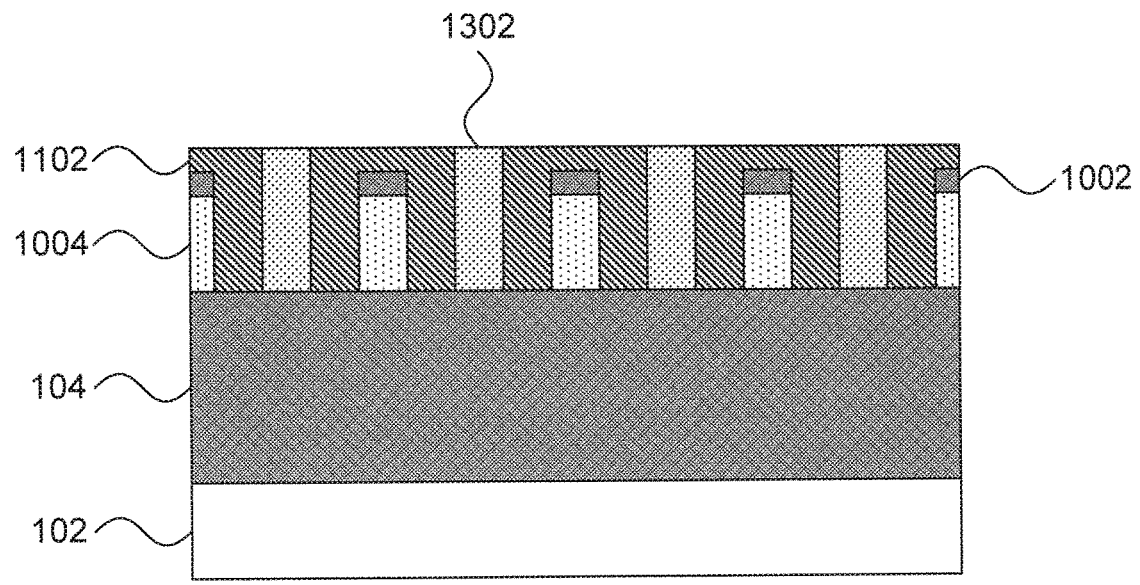
FIG. 13 is a cross-sectional diagram of a step in the formation of a tri-color hardmask in accordance with one embodiment of the present invention.

Referring now to FIG. 13, a cross-sectional diagram of a step in forming tri-color alternating hardmask is shown. The gaps 1202 are filled with a third-color hardmask material to form fins 1302. The third-color hardmask material may be, for example, silicon dioxide and may be deposited using, e.g., atomic layer deposition (ALD), spin-on deposition, or flowable deposition. Alternatively, the third-color hardmask material may be any appropriate material that has etch selectivity with the fins (the first-color hardmask material) 1004, the OPL (the second-color hardmask material) 1102, and the base fin material 104.

Figure 14:
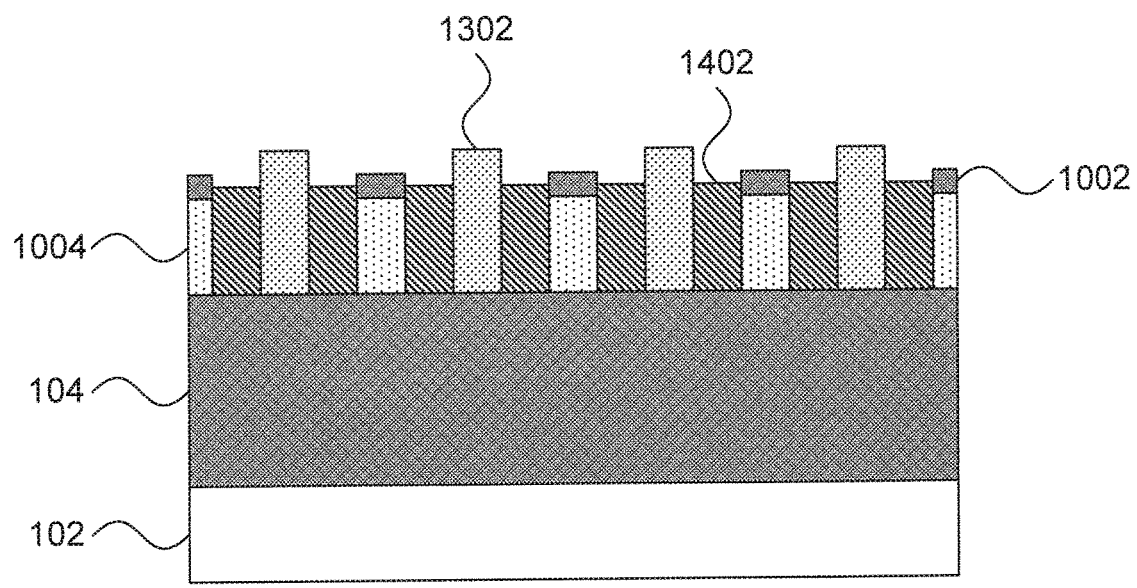
FIG. 14 is a cross-sectional diagram of a step in the formation of a tri-color hardmask in accordance with one embodiment of the present invention.

Referring now to FIG. 14, a cross-sectional diagram of a step in forming tri-color alternating hardmask is shown. The OPL 1102 is recessed below the height of the fin caps of first stack material 1002 by chemical mechanical planarization (CMP) or by ME, separating the OPL 1102 into fins of second-color hardmask material 1402. The result is a series of fins which can be selectively etched with respect to their neighbors. In particular, the fins of first-color hardmask material 1004 and the fins of third-color hardmask material 1302 have a pitch to their closest neighbor of the same material that is about half of the pitch of the original mandrels 118 (e.g., about 40 nm). Thus, a mask can be reliably formed for the removal of one fin without affecting its direct neighbors.

Figure 15:
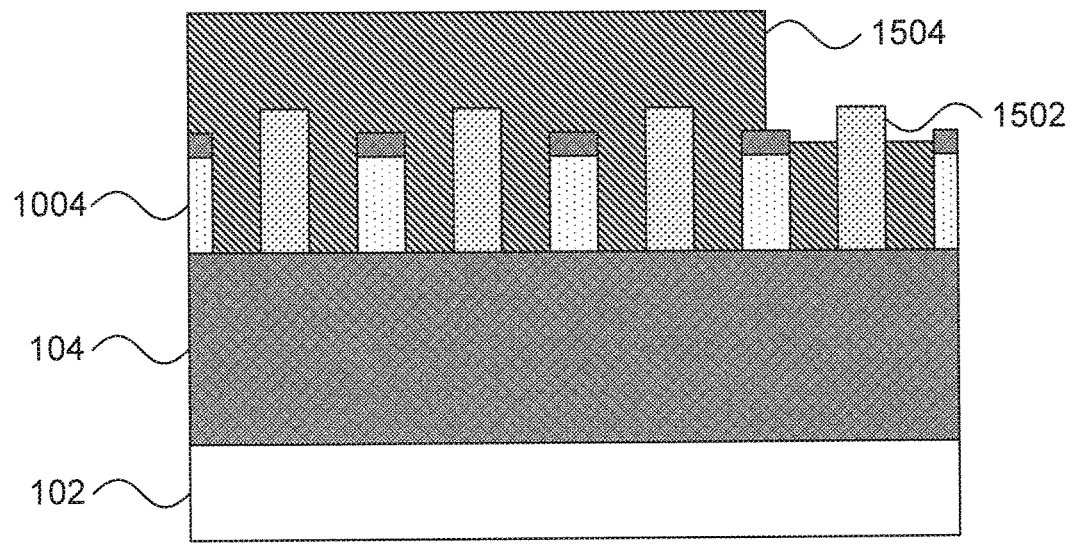
FIG. 15 is a cross-sectional diagram of a step in the selective etch of fins using a tri-color hardmask in accordance with one embodiment of the present invention.

Referring now to FIG. 15, a cross-sectional diagram of a step in selectively removing a fin is shown. A mask 1504 is formed, leaving exposed at least one fin 1502. It should be noted that the mask 1504 may expose neighboring fins as well, as long as those fins are not formed from the same material as the selected fin 1502. The mask 1504 may be formed by, e.g., chemical vapor deposition, physical vapor deposition, ALD, spin-on deposition, gas cluster ion beam (GCIB) deposition, or any other appropriate deposition process.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 16:
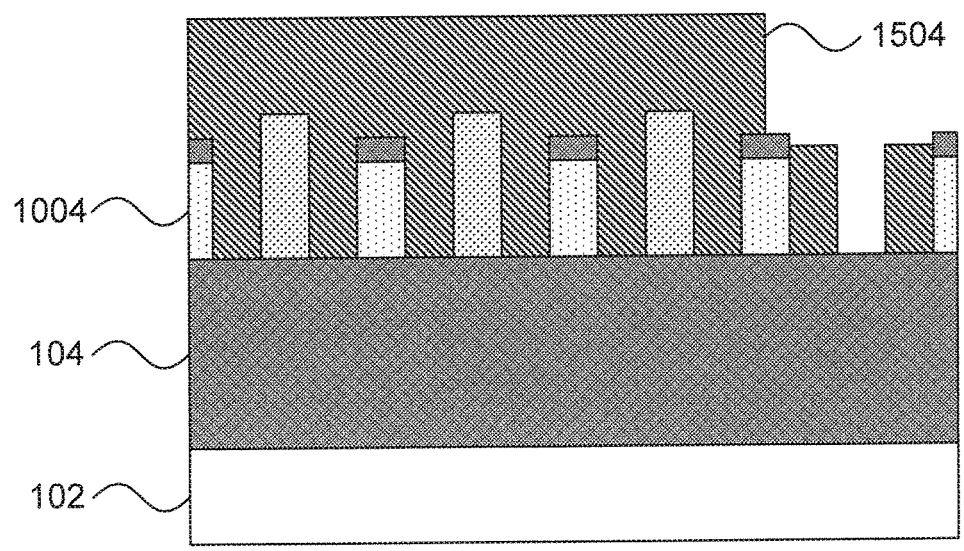
FIG. 16 is a cross-sectional diagram of a step in the selective etch of fins using a tri-color hardmask in accordance with one embodiment of the present invention.

Referring now to FIG. 16, a cross-sectional diagram of a step in selectively removing a fin is shown. The fin 1502 is etched away using any appropriate isotropic or anisotropic etch. Because the neighboring fin have etch selectivity with the selected fin 1502, they are not affected by the removal of the selected fin 1502.

Figure 17:
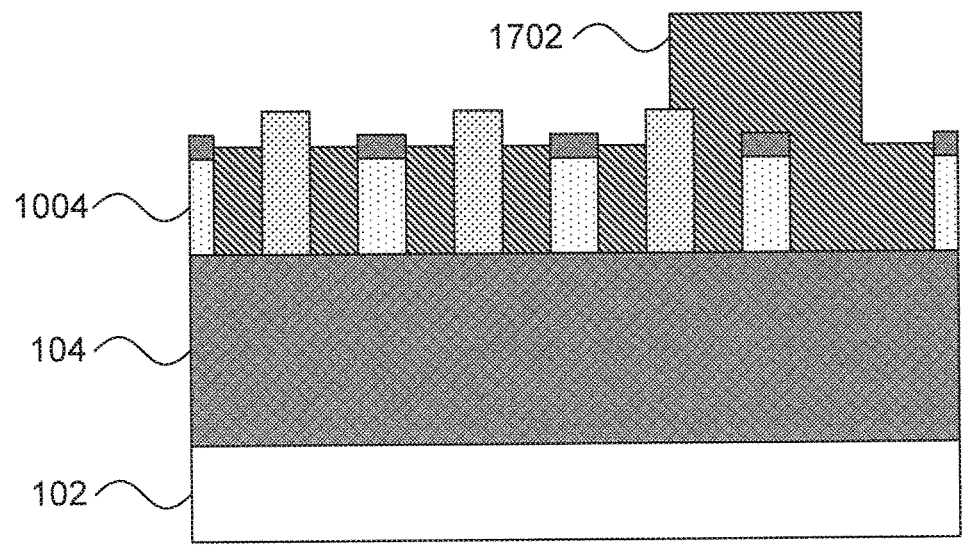
FIG. 17 is a cross-sectional diagram of a step in the selective etch of fins using a tri-color hardmask in accordance with one embodiment of the present invention.

Referring now to FIG. 17, a cross-sectional diagram of a step in selectively preserving a fin is shown. In this example, a mask 1702 is formed over a fin of a particular color to be preserved. The other fins of the first-color hardmask material 1004 remain uncovered.

Figure 18:
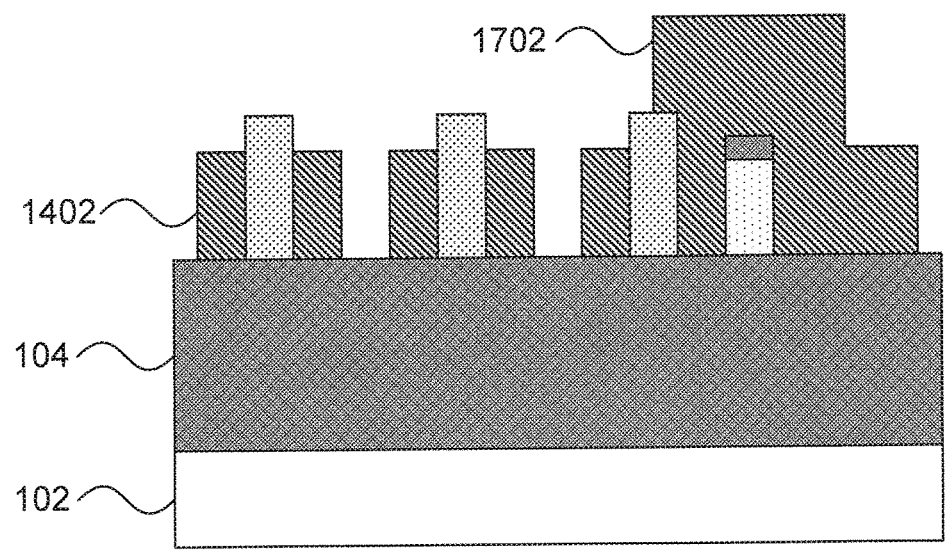
FIG. 18 is a cross-sectional diagram of a step in the selective etch of fins using a tri-color hardmask in accordance with one embodiment of the present invention.

Referring now to FIG. 18, a cross-sectional diagram of a step in selectively preserving a fin is shown. Those fins 1004 that are not covered by the mask 1702 are etched away using any appropriate etch. Because the pitch between the fins 1004 is large, there is little risk of the mask 1702 covering an unintended fin and preventing such a fin from being removed.

Figure 19:
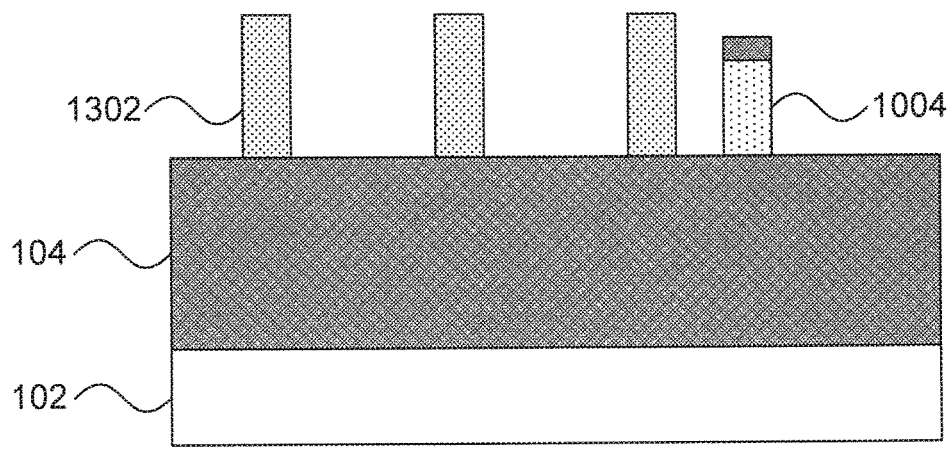
FIG. 19 is a cross-sectional diagram of a step in the selective etch of fins using a tri-color hardmask in accordance with one embodiment of the present invention.

Referring now to FIG. 19, a cross-sectional diagram of a step in forming semiconductor fins is shown. The remaining mask 1702 and the fins of the second-color hardmask material 1402 are removed by any appropriate isotropic or anisotropic etch process. The selected fins of first-color hardmask material 1004 and fins of third-color hardmask material 1302 remain on the fin base material 104.

Figure 20:
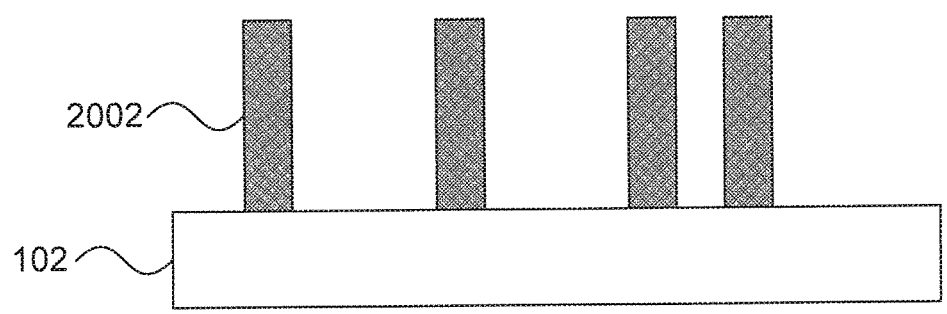
FIG. 20 is a cross-sectional diagram of a step in the selective etch of fins using a tri-color hardmask in accordance with one embodiment of the present invention.

Referring now to FIG. 20, a cross-sectional diagram of a step in forming semiconductor fins is shown. The remaining first-color fins 1004 and third-color fins 1302 are used as masks to etch the fin base material 104, producing a set of hardmask fins 2002. An appropriate directional etch such as RIE may be used, stopping on the underlying semiconductor substrate 102. The fins 2002 may be used directly in subsequent processing steps or may, alternatively, be used to form further fins in the semiconductor substrate 102 for, e.g., fin field effect transistors (FinFETs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 21:
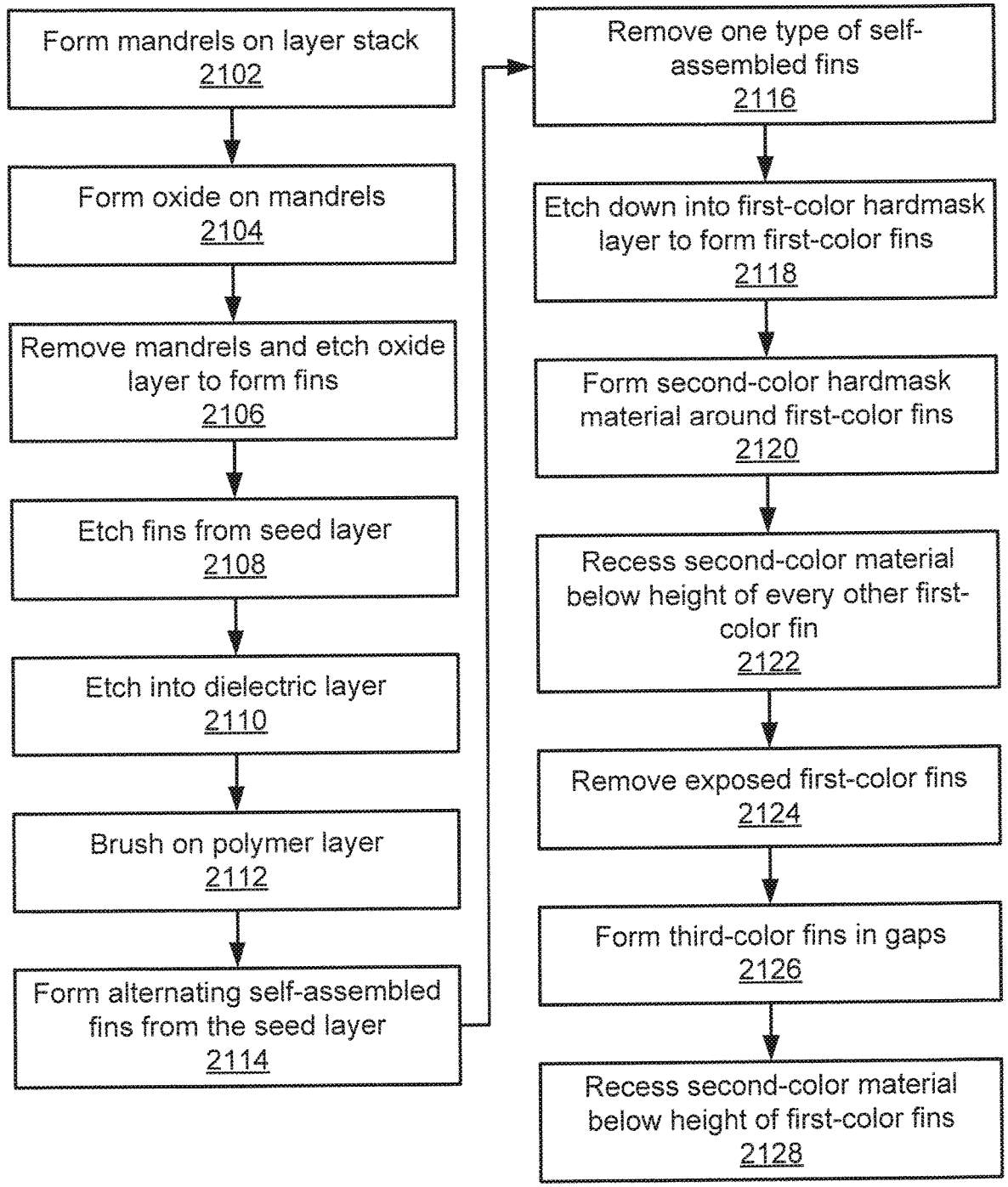
FIG. 21 is a block/flow diagram of a method of a forming tri-color hardmask in accordance with one embodiment of the present invention.

Referring now to FIG. 21, a method of forming three-color hardmask fins is shown. Block 2102 forms mandrels 118 on a stack of layers. The stack of layers is described in detail above with respect to FIG. 1. Block 2104 conformally forms an oxide layer 202 over the mandrels 118 using, e.g., CVD, ALD, PVD, or any other appropriate deposition process. Block 2106 etches back the oxide layer 202, removes the mandrels 118, and performs an isotropic etch of the remaining oxide layer 202 to form oxide fins 302.

Block 2108 uses the oxide fins as a mask to etch down into the protection layer 114 and the seed layer 112 with any appropriate anisotropic etch, creating seed layer fins 402. Block 2110 etches down into second stack layer 110 before block 2112 forms a monolayer of polymer brush material 702 on the first stack layer 108 between the seed layer fins 402.

Block 2114 forms alternating, self-assembled fins 802, 804, and 806 from the guiding pattern, using molecular chains that have one block that is attracted by the seed layer 402 and one block that sits on brush material 702. Block 2116 then removes one type of the fins (particularly fins 804) using a selective etch process. Block 2118 etches down into a first-color hardmask material 106 to form first-color fins 1004.

Block 2120 forms second-color hardmask material (e.g., OPL 1102) in the gaps between the first-color fins 1004. Block 2122 then recesses the second-color hardmask material down below the height of every other first-color fin, such that the second-color hardmask material has a height below the height of half of the first-color fins 1004 and above the height of the other half of the first color fins 1004.

Block 2124 removes the exposed first-color fins using any appropriate etch to form gaps 1202. Block 2126 forms third-color hardmask material in the gaps 1202. This material may be deposited by any appropriate deposition process and then polished down using, e.g., chemical mechanical planarization. CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Block 2128 recesses the second-color material below the height of all the first-color fins 1004. The result is three sets of fins: first-color fins 1004, second-color fins 1402, and third-color fins 1302. Each color of fins has etch selectivity with each of the others, such that positioning or size errors in a mask that covers or uncovers a particular fin are unlikely to affect neighboring fins of the same color.

Figure 22:
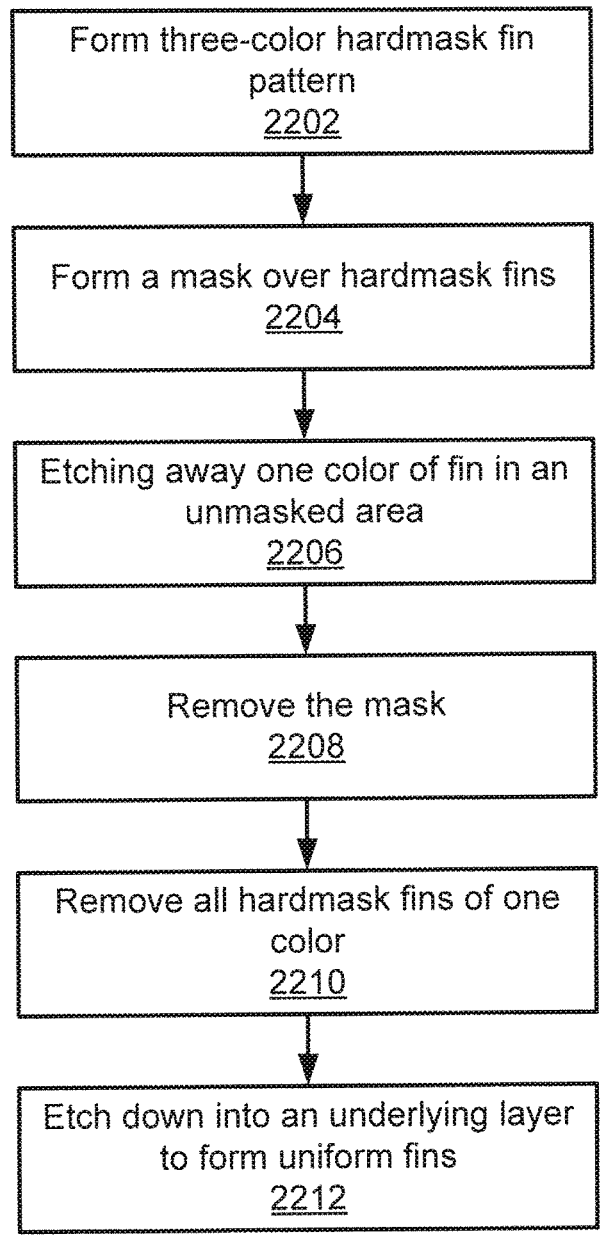
FIG. 22 is a block/flow diagram of a method of etching fins using a tri-color hardmask in accordance with one embodiment of the present invention.

Referring now to FIG. 22, a method of fin formation is shown. Block 2202 forms a three-color hardmask fin pattern, for example in the manner described above with respect to FIG. 21. The hardmask materials of the fins are formed in the sequence of Color ABCBABCBA . . . Block 2204 forms a mask over the three-color hardmask fins, leaving one or more fins exposed. Block 2206 etches away one color of fin in the exposed area, leaving any other color of fin that may be exposed unharmed. Block 1808 removes the mask. One can repeat 2204 to 2208 multiple times to select different colors of fins to customize before moving onto block 2210, which removes all hardmask fins of one of the three colors. In the examples above, this refers to the second-color fins 1004. Block 2212 then etches down into an underlying layer (e.g., fin base material 104) to form fins of a uniform material, but with variable spacing.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An integrated circuit manufacturing process comprising:
    providing a substrate having thereon a plurality of layers comprising dielectric layers or other layers suitable for a hardmask;
    forming a seed layer on the plurality of layers;
    forming a protection layer on the seed layer;
    forming a plurality of mandrels on or above the protection layer;
    forming a sidewall-spacer-forming layer over the mandrels;
    anisotropically etching the sidewall-spacer-forming layer to form sidewall spacers on the mandrels;
    removing the mandrels, thereby forming a set of first hardmask fins and a first hardmask fin pattern;
    etching to expose (i) opposing sidewalls of the seed layer and (ii) opposing sidewalls and an upper surface of the protection layer;
    removing the protection layer to form a second set of fins in the first hardmask fin pattern, wherein uppermost layers of the second set of fins comprise the seed layer;
    using a directed self-assembly process to form a two-color fin pattern of alternating colors, wherein the two-color fin pattern of alternating colors comprises alternating fins of fourth and fifth colors, and wherein a pattern formed by every other fourth-color fin corresponds to the first hardmask fin pattern; and
    etching, including selectively etching the fins of the fifth color, to form a second hardmask fin pattern, wherein the second hardmask fin pattern comprises fins, and wherein alternating fins have different uppermost material layers.

2. The process of claim 1, wherein prior to using the directed self-assembly process, an uppermost material layer of the second set of fins is the seed layer.

3. The process of claim 2, further comprising:
    removing unetched portions of the protection layer with a solvent.

4. The process of claim 1, wherein forming a plurality of mandrels on or above the protection layer further comprises:
    depositing a first dielectric layer on the protection layer wherein the first dielectric layer is the same material as the sidewall-spacer-forming layer.

5. The process of claim 1, wherein the plurality of mandrels are formed using HMDS.

6. The process of claim 1, wherein the set of first hardmask fins comprise oxide.

7. The process of claim 1, wherein the second hardmask fin pattern has a center-center fin pitch approximately one-half of a center-center fin pitch of the first hardmask fin pattern.

8. The process of claim 1, further comprising:
    selectively filling gaps in the second hardmask fin pattern with a first gap-filling material.

9. The process of claim 8, wherein the first gap-filling material comprises an organic planarization layer.

10. The process of claim 8, further comprising:
    recessing the first gap-filling material to expose a top of every other fin of the second hardmask fin pattern, wherein pattern formed by exposed fin tops corresponds to the first hardmask fin pattern;
    selectively etching the fins having exposed fin tops to create gaps corresponding to the first hardmask fin pattern;
    selectively filling the gaps corresponding to the first hardmask fin pattern with a second gap-filling material to create fins of a third color; and
    further recessing the first gap-filling material to create fins of a first color and a second color, thereby creating a three-color hardmask fin pattern, wherein fins of the second color comprise the first gap-filling material.

11. The process of claim 10 wherein the fins of a third color comprise oxide.

12. The process of claim 10, further comprising:
    masking a first region of the three-color hardmask fin pattern, exposing (i) at least one fin of a first fin color to be etched and (ii) at least one fin of the fins of the other two fin colors, wherein the first fin color to be etched is one of the first, second, or third fin colors; and
    etching away exposed fins of the first fin color to be etched with a selective etch that does not remove the fins of the other two fin colors.

13. The process of claim 12, further comprising:
    masking a second region of the three-color hardmask fin pattern, exposing (i) at least one fin of a second fin color to be etched and (ii) at least one fin of the fins of the other two fin colors; and
    etching away exposed fins of the second fin color to be etched, wherein the second fin color to be etched is a different one of the first, second, or third colors than the first fin color to be etched, with a selective etch that does not remove fins of the other two fin colors.

14. The process of claim 13, further comprising:
    transferring the pattern formed by the remaining fins to a lower layer of the plurality of layers, or to the substrate.

15. The process of claim 1, wherein the two-color fin pattern of alternating colors comprises self-assembling fins of different polymer materials.

16. The process of claim 15, wherein one of the different polymer materials is attracted to the seed layer.

* * * * *